(12) United States Patent
Funakoshi et al.

(10) Patent No.: US 7,477,300 B2
(45) Date of Patent: Jan. 13, 2009

(54) SEMICONDUCTOR APPARATUS WITH CROSSTALK NOISE REDUCTION CIRCUIT

(75) Inventors: Jun Funakoshi, Kawasaki (JP); Tsuyoshi Higuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 715 days.

(21) Appl. No.: 11/142,310

(22) Filed: Jun. 2, 2005

(65) Prior Publication Data

US 2006/0176383 A1 Aug. 10, 2006

(30) Foreign Application Priority Data

Feb. 4, 2005 (JP) ............................. 2005-028446

(51) Int. Cl.
*H04N 5/217* (2006.01)
(52) U.S. Cl. ...................................... 348/241
(58) Field of Classification Search ........................ None
See application file for complete search history.

(56) References Cited

U.S. PATENT DOCUMENTS 5,528,168 A 6/1996 Kleveland
6,201,270 B1 * 3/2001 Chen ........................... 257/292
6,493,030 B1 12/2002 Kozlowski et al.
7,119,839 B1 * 10/2006 Mansoorian ................. 348/308

FOREIGN PATENT DOCUMENTS

| JP | 8-129158 | 5/1996 |
| JP | 2003-134399 | 5/2003 |
| JP | 2004-159274 | 6/2004 |
| KR | 10-2000-0019073 A | 4/2004 |

OTHER PUBLICATIONS

European Office Action dated Sep. 18, 2006.

* cited by examiner

*Primary Examiner*—David L Ometz
*Assistant Examiner*—Akshay Trehan
(74) *Attorney, Agent, or Firm*—Arent Fox LLP.

(57) ABSTRACT

In order to reduce crosstalk caused between control signal wires in a semiconductor apparatus without increasing the size of the semiconductor apparatus, a noise guard circuit is provided at the opposite end of the control signal wire to the driver circuit. The noise guard circuit controls in such a way as to increase the impedance between the relevant control signal wire and a fixed potential when the logic of the relevant control signal wire is positive logic for driving the element, and as to decrease the impedance between the relevant control signal wire and a fixed potential when the logic of the relevant control signal wire is negative logic for driving the element.

11 Claims, 6 Drawing Sheets

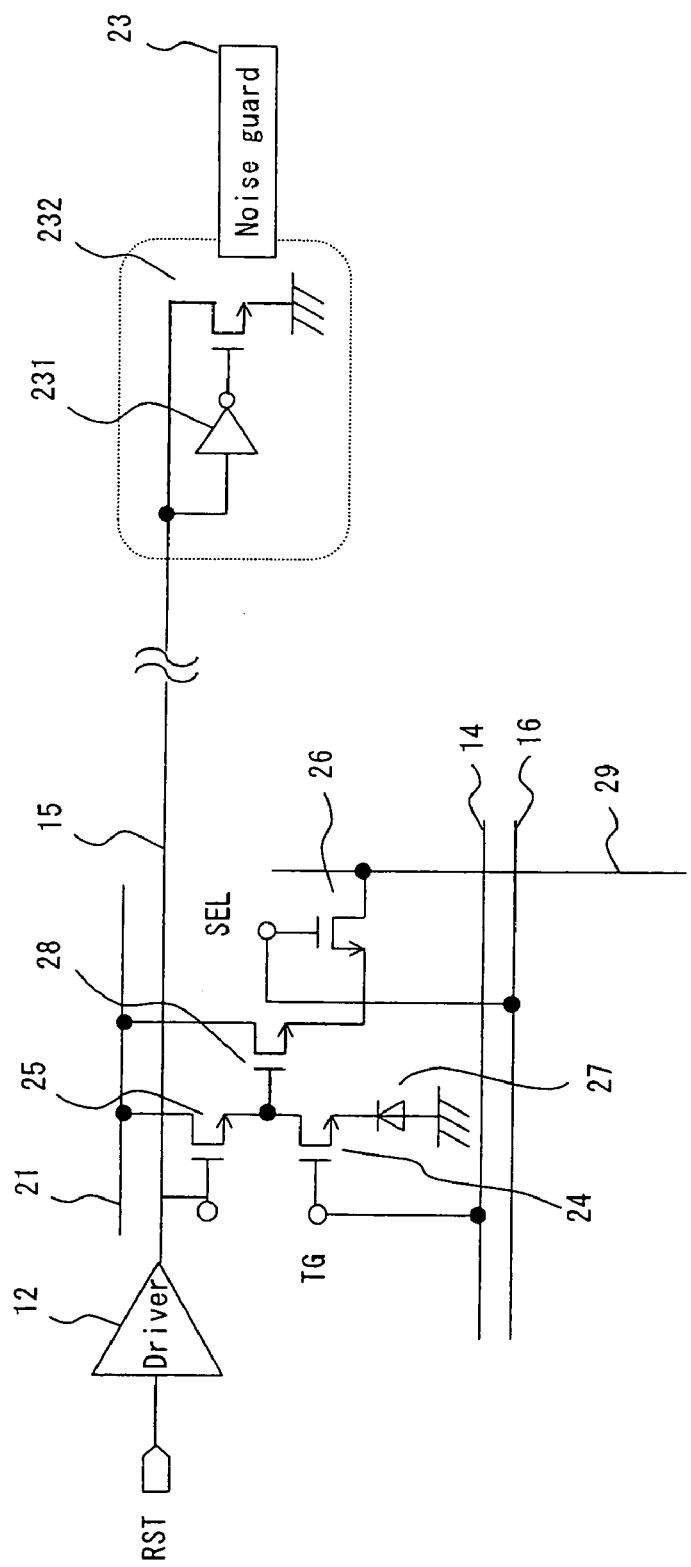
F I G. 2

SEMICONDUCTOR APPARATUS WITH CROSSTALK NOISE REDUCTION CIRCUIT

CROSS REFERENCE TO RELATED APPLICATIONS

This application is based upon and claims the benefit of priority from the prior Japanese Patent Application No. 2005-028446, filed on Feb. 4, 2005, the entire contents of which are incorporated herein by reference.

BACKGROUND OF THE INVENTION

1. Field of the Invention

The present invention relates to a technology for reducing crosstalk noise between signal wires in a semiconductor apparatus, such as a solid-state image sensing device and the like.

2. Description of the Prior Art

Some semiconductor apparatus, such as a solid-state image sensing device, a liquid crystal displaying device, semiconductor memory and the like, comprises a plurality of driver circuits, a plurality of types of control signal wires connected to the driver circuits, for transmitting control signals and a group of elements which are connected to the plurality of types of control signal wires and driven by the driver circuits.

Such a semiconductor apparatus always has the problem of crosstalk between signal wires and a mis-operation due to it. This problem is described below using a solid-state image sensing device as an example.

As described in the following Patent reference 1 and Patent reference 2, a solid-state image sensing device, such as a complementary metal-oxide semiconductor (CMOS) image sensor or the like, has an array of pixels which are composed of a photo diode and a plurality of transistors, a shift register for specifying a pixel to read and a driver circuit for controlling the transistors of each pixel and the like which are disposed around the pixels, and control signal wires are wired in the array.

With the development of a semiconductor integrated circuit technology, the size of the pixel of the solid-state image sensing device has decreased and an array size has increased beyond a mega-pixel (that is, one side of the array has got long. Then, crosstalk easily occurs between control signals in the pixel.

When the control signal of the first control wire in the pixel changes, crosstalk noise occurs in the second control signal wire installed adjacently to the first control wire, and the second control signal sometimes changes unintentionally.

For example, if the first and second control signals are a charge transfer control signal and a pixel reset signal, respectively, the pixel reset signal resets a stored signal unintentionally and an output image degrades. Since the degree of this phenomenon varies depending on a distance from a driver in the pixel array, the output image obtains a shading characteristic.

Prior technical literatures related to the present invention are introduced below.

As described above, each of Patent Reference 1 and Patent Reference 2 discloses a solid-state image sensing device. Patent Reference 1 relates to a technology for expanding the dynamic range of a sensor in a solid-state image sensing device to a high-illuminance side or the like. Although as to noise in an image sensor, it discloses reset noise caused when initializing signal charge, it does not disclose crosstalk between control signals in a pixel.

Patent Reference 2 discloses that the number of wires is reduced in a solid-state image sensor. The solid-state image sensor described in Patent Reference 2 is provided with a shift register for selecting a pixel located in the vertical direction, on each side of a pixel array. However, even Patent Reference 2 fails to disclose crosstalk between control signals in the pixel.

Patent Reference 3 relates to a liquid crystal display and discloses that a compensation voltage application circuit is provided on the opposite side of a signal driver across a liquid crystal display device in order to solve a problem that display variation (crosstalk) occurs on a screen. In Patent Reference 3 too, pixels are disposed in array and signal wires are wired, but it fails to disclose crosstalk problem between signal wires.

As described above, conventionally, as measures for reducing crosstalk between signal wires, a sufficient distance is secured between signal wires in a design stage. Or, countermesure at each element in a semiconductor apparatus is considered for preventing mis-operation due to crosstalk. However, such measures lead to increase a chip area and to increase the size of the semiconductor apparatus, which is not favorable.

It is not preferable to adopt such crosstalk reduction measures that increase the number of wires in the semiconductor apparatus, or interfere with the logic for driving each element in the semiconductor apparatus and restrict the driving logic.

Patent reference 1: Japanese Published Patent Application No. 2004-159274

Patent reference 2: Japanese Published Patent Application No. 2003-134399

Patent reference 3: Japanese Published Patent Application No. H08-129158

SUMMARY OF THE INVENTION

It is an object of the present invention to reduce the influence of crosstalk noise caused between control signal wires inside a semiconductor apparatus without increasing the size of the semiconductor apparatus especially in a semiconductor apparatus comprising a plurality of driver circuits, a plurality of control signal wires connected to each of the plurality of driver circuits, for transmitting control signals from each of the driver circuits and a plurality of elements which are connected to the plurality of the control signal wires, and are supplied and driven with control signals by the driver circuits.

A noise guard circuit for a control signal wire to reduce the influence of crosstalk noise is provided at the opposite end of the control signal wire to the driver circuit. The noise guard circuit controls in such a way as to increase the impedance between the relevant control signal wire and a fixed potential when the logic of the relevant control signal wire is positive logic for driving the element, and as to decrease the impedance between the relevant control signal wire and a fixed potential when the logic of the relevant control signal wire is negative logic for driving the element.

Thus, a mis-operation due to crosstalk can be prevented and also the increase of a chip area can be prevented.

BRIEF DESCRIPTION OF THE DRAWINGS

FIG. 2 shows the circuit configuration of the first preferred embodiment of the present invention.

DESCRIPTION OF THE PREFERRED EMBODIMENTS

The present invention is described below using a solid-state image sensing device as an example of the semiconductor apparatus, and both a reset signal wire for resetting a stored pixel and a transfer gate signal wire for controlling the transfer of charge stored in a pixel as examples of the control signal wires.

Figure 1:
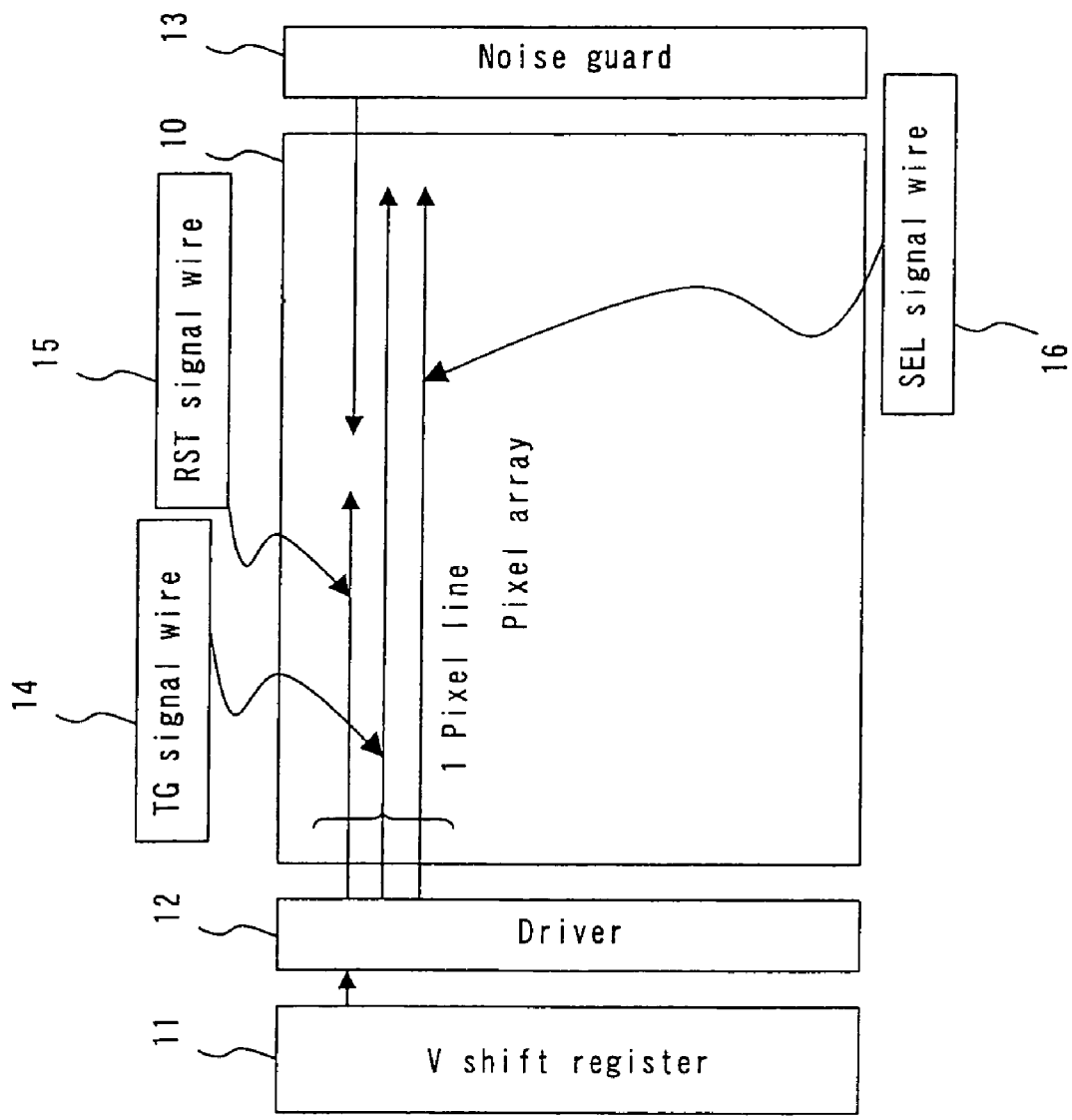
FIG. 1 shows the basic configuration of the present invention.

FIG. 1 shows the basic configuration of the present invention. A V shift register 11 for selecting a pixel located in the vertical direction and the driver 12 of a control signal wire are disposed on one side of a pixel array 10 and a noise guard 13 is disposed on the other side. As the control signal wires, a transfer gate (TG) signal wire 14, a reset (RST) signal wire 15 and a selection (SEL) signal wire 16 are described. Only the reset signal wire 15 is connected to the noise guard 13.

The reset signal wire 15 is divided into an arrow line from the driver side and an arrow line from the noise guard side. This indicates that in the present invention, sufficient reset signals are supplied on the noise guard side that is far away from the driver side which is the other side.

The preferred embodiments of the present invention are described below with reference to FIGS. 2 through 5.

The First Preferred Embodiment

Figure 3:
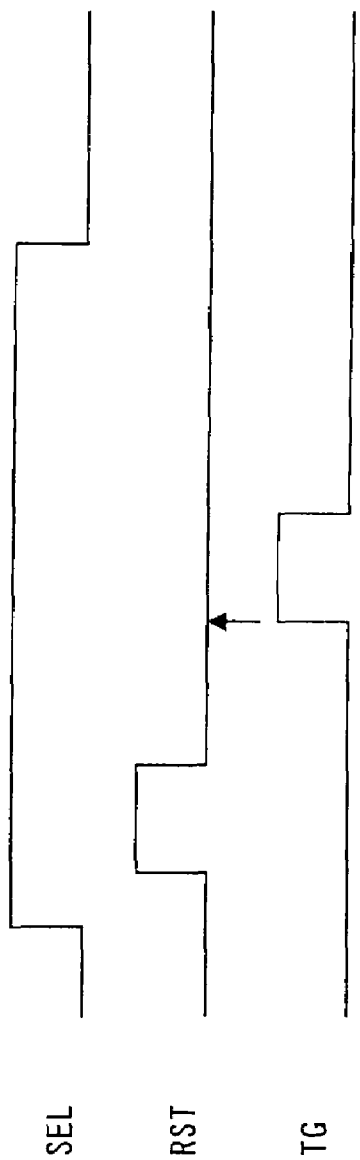
FIG. 3 is the operational timing chart of the control signal wires in the first preferred embodiment of the present invention.

FIG. 2 shows the circuit configuration of the first preferred embodiment displaying one pixel of the solid-state image sensing device of the present invention and a noise guard provided on a line to which the pixel belongs. FIG. 3 is the operational timing chart of the control signal wires at the time of pixel reading in the first preferred embodiment.

The noise guard 23 shown in FIG. 2 comprises an inverter 231 for inverting the logic of the reset signal wire 15, and an N-channel MOS transistor 232 to the gate of which the output of the inverter 231 is connected, the drain of which is connected to the reset signal wire 15 and the source of which is connected to the ground.

As shown in FIG. 3, at the time of pixel reading, firstly the selection signal SEL rises up, and a read transistor 26 is becomes ON. Then, when the reset signal becomes High, a reset transistor 25 becomes ON and residual charge is eliminated. At a predetermined time after the reset signal returns to Low, the transfer signal becomes High and a charge transfer transistor 24 becomes ON. Thus, signal charge stored in a photo diode 27 is extracted, is amplified by an amplification transistor 28 and is outputted to an output signal line 29 via the read transistor 26. A line with a reference numeral 21 is a power feeding line.

The noise guard 23 adopts the logic of a reset signal, and its impedance is low when there is no reset signal since the transistor 231 is ON. Therefore, even when the transfer gate signal rises up, crosstalk noise can be reduced.

When the reset signal rises up, the transistor 231 becomes OFF and the same effect as obtained when a reset signal is also supplied from the opposite side of the driver 12 can be obtained.

The Second Preferred Embodiment

Figure 4:
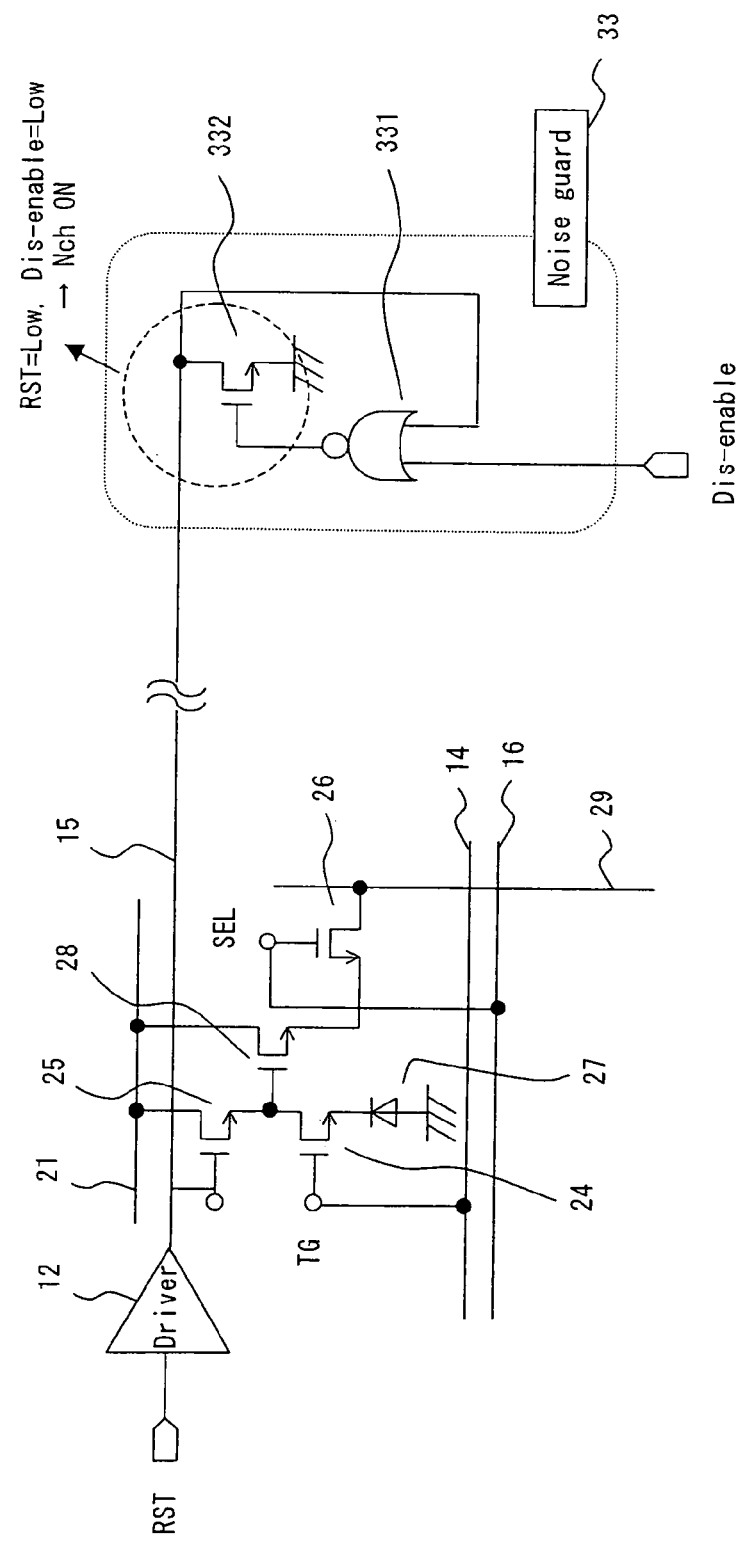
FIG. 4 shows the circuit configuration of the second preferred embodiment of the present invention.

FIG. 4 shows the circuit configuration of the second preferred embodiment of the present invention. The same reference numerals are attached to the same parts as in the first preferred embodiment. A pixel part is the same as in FIG. 2, and the configuration of a noise guard 33 is different from that shown in FIG. 2. Each of FIGS. 5A and 5B is the operational timing chart of each control signal wire at the time of pixel reading in the second preferred embodiment.

In the noise guard 33 in the second preferred embodiment, the logic of a reset signal wire is supplied to the gate of a transistor 332 via an NOR circuit 331. The signal of a disenable terminal is supplied to the other input of the NOR circuit 331.

Namely, the noise guard 33 in the second preferred embodiment is obtained by replacing the inverter 231 of the noise guard 23 in the first preferred embodiment with the NOR circuit 331 and a control signal can be inputted from the outside.

Figure 5A:
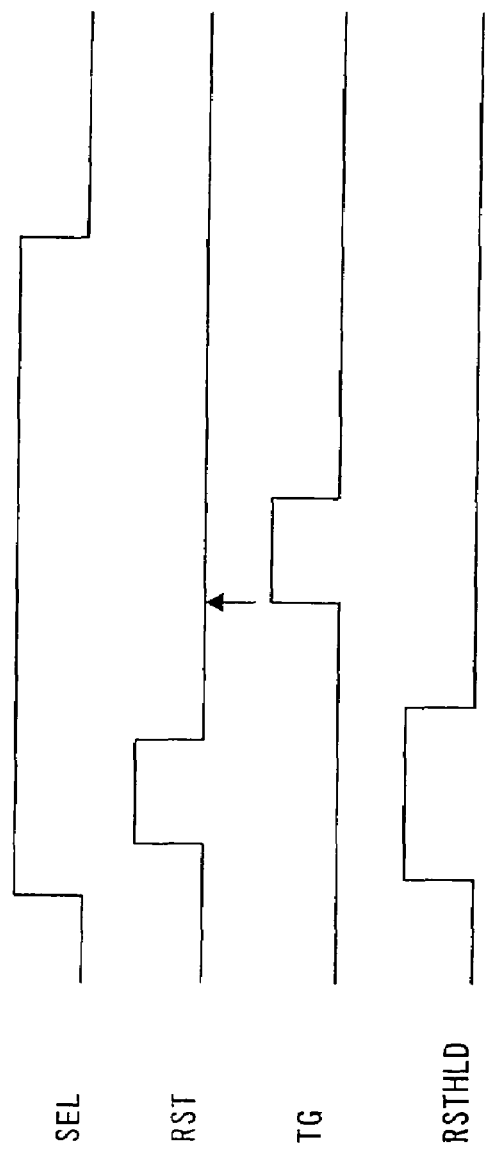
FIG. 5A is the first operational timing chart of control signal wires in the second preferred embodiment of the present invention.
Figure 5B:
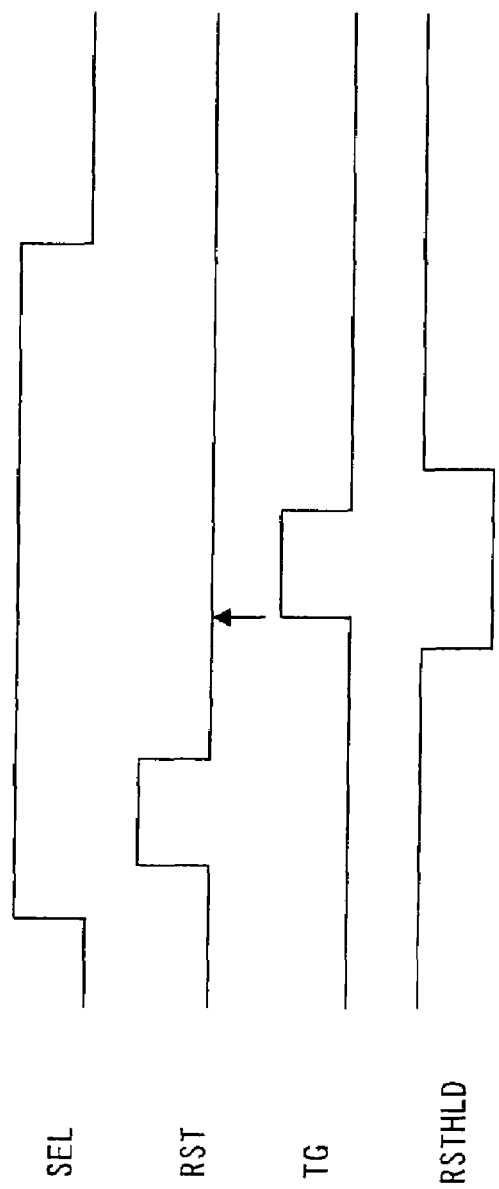
FIG. 5B is the second operational timing chart of control signal wires in the second preferred embodiment of the present invention.

As to the selection (SEL) signal, reset signal and transfer gate signal, the operational timing of each control signal wire at the time of pixel reading shown in FIGS. 5A and 5B is the same as in the first preferred embodiment shown in FIG. 3, and the second preferred embodiment differs from the first preferred embodiment in that a reset hold (RSTHLD) signal to be supplied to the disenable terminal is added.

The reset hold signal shown in FIG. 5A is used when a reset signal wire is guarded for a long time. The reset hold signal rises up immediately before the reset signal rises up, and falls down immediately after the reset signal falls down. Therefore, the impedance between the reset signal wire and the ground becomes high during a reset period, and otherwise it becomes low. Therefore, a reset operation can be secured, and also the influences of crosstalk from the transfer gate signal wire and other noise can be avoided.

The reset hold signal shown in FIG. 5B is used when the reset signal wire is guarded for a short time. The reset hold signal falls down from High to Low before the transfer gate signal rises up and after the reset signal falls down, and returns to High after the transfer gate signal falls down. Therefore, the impedance between the reset signal wire and the ground can be kept low before the transfer gate signal rises up. Therefore, crosstalk by the transfer gate signal can be prevented.

The use of the disenable terminal shown in FIG. 4 is not limited to the reset hold signal shown in FIGS. 5A and 5B and the disenable terminal can also be used for a variety of signal inputs according to its application. For example, the disenable terminal can also be used to always keep the transistor 332 OFF.

So far how to reduce crosstalk between the reset signal wire and transfer gate wire of a solid-state image sensing device is described in detail using an example. However, it is obvious for a person having an ordinary skill in the art that the target of the present invention is not limited to the crosstalk between the reset signal wire and transfer gate wire of a solid-state image sensing device.

The noise guard of the present invention is provided at the opposite end to the driver side of a control signal wire, which is a noise guard target, and in case of the minimum configuration, it can be realized by one transistor and one inverter. Therefore, it does not increase a chip area much. Furthermore, since the noise guard of the present invention basically operates on the logic of its control signal wire, it requires no special control signal for it. Therefore, there is no need to increase the number of wires, and the logic is compatible with other control logic since it does not interfere with the other control logic.

As the one transistor for reducing the impedance of a control signal wire, one with a large size can be adopted in order to further reduce the impedance.

If the present invention is applied in order to reduce the crosstalk between the reset signal wire and transfer gate wire of a solid-state image sensing device, the following effects can further obtained.

(1) Since unintentional reset can be prevented, the pixel position dependency of an output image (shading) can be reduced.
(2) Since a noise guard is provided outside a pixel, the filfactor of a pixel is never reduced.
(3) Since the filfactor of a pixel and the number of wires are not changed, sensitivity does not degrade.
(4) The present invention is compatible with a device requiring the logic of pixel scanning, such as blooming countermeasures or the like.

The present invention is not limited to the above-mentioned preferred embodiments, and a variety of its variations and modifications can be possible as long as the subject matter of the present invention is not deviated.

What is claimed is:

1. A semiconductor apparatus having a plurality of driver circuits, a plurality of control signal wires connected to each of the plurality of driver circuits, for transmitting control signals from each of the driver circuits and a plurality of elements which are connected to the plurality of the control signal wires, and are supplied and driven with control signals by the driver circuit, further comprising
    a noise guard circuit for controlling impedance between the relevant control signal wire and a fixed potential by logic of the relevant control signal wire, at an opposite end of at least one of the control signal wires to the driver circuit which is connected to an end of the control signal wire.

2. The semiconductor apparatus according to claim 1, wherein
    said noise guard circuit controls in such a way as to increase the impedance between the relevant control signal wire and a fixed potential when logic of said at least one of the control signal wires is positive logic for driving the element, and controls in such a way as to decrease the impedance between the relevant control signal wire and a fixed potential when logic of said at least one of the control signal wires is negative logic for driving the element.

3. The semiconductor apparatus according to claim 2, wherein
    said noise guard circuit comprises an inverter circuit for inverting logic of said at least one of the control signal wires and a transistor to the gate of which output of the inverter circuit is connected, the drain of which is connected to the control signal wire and the source of which is connected to the fixed potential.

4. The semiconductor apparatus according to claim 2, wherein
    said noise guard circuit comprises a NOR circuit one input of which is connected to said at least one of the control signal wires and the other input of which is connected to an external terminal, and a transistor to the gate of which the output of the NOR circuit is connected, the drain of which is connected to the control signal wire and the source of which is connected to the fixed potential.

5. The semiconductor apparatus according to claim 4, wherein
    a signal which turns the transistor off when the control signal of said at least one of the control signal wires rises up and turns the transistor on before the relevant control signal rises up in the control signal wire which gives an influence of crosstalk to said at least one of the control signal wires is supplied to the external terminal.

6. A solid-state image sensing device which comprises a driver circuit for enabling a pixel in a pixel array only on one side of the pixel array to operate via a control signal wire, further comprising
    a noise guard circuit for controlling impedance between the relevant control signal wire and a fixed potential by logic of the relevant control signal wire, at an opposite end of at least one of the control signal wires to the driver circuit which is connected to an end of the control signal wire.

7. The solid-state image sensing device according to claim 6, wherein
    said noise guard circuit controls in such a way as to increase the impedance between the relevant control signal wire and a fixed potential when logic of said at least one of the control signal wires is positive logic for driving the element, and controls in such a way as to decrease the impedance between the relevant control signal wire and a fixed potential when logic of said at least one of the control signal wires is negative logic for driving the element.

8. The solid-state image sensing device according to claim 7, wherein
    said noise guard circuit comprises an inverter circuit for inverting logic of said at least one of the control signal wires and a transistor to the gate of which output of the inverter circuit is connected, the drain of which is connected to the control signal wire and the source of which is connected to the fixed potential.

9. The solid-state image sensing device according to claim 7, wherein
    said noise guard circuit comprises a NOR circuit one input of which is connected to said at least one of the control signal wires and the other input of which is connected to an external terminal, and a transistor to the gate of which the output of the NOR circuit is connected, the drain of which is connected to the control signal wire and the source of which is connected to the fixed potential.

10. The solid-state image sensing device according to claim 9, wherein
    a signal which turns the transistor off when the control signal of said at least one of the control signal wires rises up and turns the transistor on before the relevant control signal rises up in the control signal wire which gives an influence of crosstalk to said at least one of the control signal wires is supplied to the external terminal.

11. The solid-state image sensing device according to claim 10, wherein
    said at least one of the control signal wires is a reset signal wire, and the control signal wire which gives the influence of crosstalk is a transfer gate signal wire.

* * * * *